United States Patent [19]
Shin et al.

[11] Patent Number: 5,854,511
[45] Date of Patent: Dec. 29, 1998

[54] SEMICONDUCTOR PACKAGE INCLUDING HEAT SINK WITH LAYERED CONDUCTIVE PLATE AND NON-CONDUCTIVE TAPE BONDING TO LEADS

[75] Inventors: Won Sun Shin; Won Kyun Lee, both of Seoul, Rep. of Korea

[73] Assignees: Anam Semiconductor, Inc., Seoul, Rep. of Korea; Amkor Technology, Inc., Chandler, Ariz.

[21] Appl. No.: 749,450

[22] Filed: Nov. 15, 1996

[30] Foreign Application Priority Data

Nov. 17, 1995 [KR] Rep. of Korea .................. 1995-41844
Nov. 29, 1995 [KR] Rep. of Korea .................. 1995-44554

[51] Int. Cl.⁶ .......................... H01L 23/10; H01L 23/28; H01L 23/34; H05K 7/20
[52] U.S. Cl. .......................... 257/713; 257/712; 257/675; 257/676; 257/706; 257/707; 257/796
[58] Field of Search .................................. 257/713, 712, 257/675, 717, 720, 706, 796, 676, 668, 707, 722, 787; 361/704, 714

[56] References Cited

U.S. PATENT DOCUMENTS

| | | | |
|---|---|---|---|
| 5,055,911 | 10/1991 | Ogata | 257/667 |
| 5,402,006 | 3/1995 | O'Donley | 257/675 |
| 5,578,869 | 11/1996 | Haffman et al. | 257/691 |
| 5,583,378 | 12/1996 | Marrs et al. | 257/712 |
| 5,596,231 | 1/1997 | Combs | 257/712 |
| 5,608,267 | 3/1997 | Mahulikar et al. | 257/796 |
| 5,629,561 | 5/1997 | Shin et al. | 257/712 |
| 5,629,835 | 5/1997 | Mahulikar et al. | 257/713 |
| 5,650,663 | 7/1997 | Parthasarathi | 257/675 |
| 5,650,915 | 7/1997 | Alfaro et al. | 257/710 |
| 5,652,463 | 7/1997 | Weber et al. | 257/796 |
| 5,661,337 | 8/1997 | Manteghi | 257/676 |
| 5,675,474 | 10/1997 | Nagase et al. | 257/712 |
| 5,679,978 | 10/1997 | Kawahara et al. | 257/697 |
| 5,691,567 | 11/1997 | Lo et al. | 257/675 |

*Primary Examiner*—Tom Thomas
*Assistant Examiner*—Alexander Oscar Williams
*Attorney, Agent, or Firm*—Skjerven Morrill MacPherson Franklin & Friel LLP; Thomas S. MacDonald

[57] ABSTRACT

A semiconductor package provided with a heat sink adapted to discharge heat from the package. The package has an oxidation film formed on an upper surface portion of the heat sink to which a semiconductor chip is attached, thereby improving the bonding between the semiconductor chip and heat sink to prevent the occurrence of an interface peel-off and the formation of cracks. This results in an improvement in reliability. A silver layer or a double layer consisting of a nickel layer and a palladium layer formed over the nickel layer is plated on the remaining upper surface portion of the heat sink not attached with the semiconductor chip. Accordingly, it is also possible to achieve easy ground bonding and power bonding. This results in an improvement in performance of the finally produced semiconductor package.

15 Claims, 4 Drawing Sheets

SEMICONDUCTOR PACKAGE INCLUDING HEAT SINK WITH LAYERED CONDUCTIVE PLATE AND NON-CONDUCTIVE TAPE BONDING TO LEADS

BACKGROUND OF THE INVENTION

1. Field of the Invention

The present invention relates to a semiconductor package provided with a heat sink and a surface treating method for such a heat sink. More particularly, the present invention relates to a semiconductor package provided with a heat sink having a black-oxidized upper surface portion to which a semiconductor chip is attached, thereby improving the bonding between the semiconductor chip and heat sink to prevent the occurrence of an interface peel-off and the formation of cracks, while having a silver layer, a doubly plated layer consisting of a nickel layer and a palladium layer formed over the nickel layer or at least one ground/power bonding plane on the remaining upper surface portion on which the semiconductor chip is not attached, thereby achieving an easy ground bonding and power bonding, so that the package has an improved performance.

2. Description of the Prior Art

Referring to FIG. 6, a typical semiconductor package provided with a heat sink is illustrated. As shown in FIG. 6, the semiconductor package includes a semiconductor chip 1 integrated with an electronic circuit, and a heat sink 2 having an upper surface on which the semiconductor chip 1 is centrally attached by an epoxy resin layer 6. A plurality of leads 3 are attached to opposite lateral end portions of the upper surface of the heat sink 2 by bonding tapes 7, respectively. The leads 3 serve to transmit signals from the semiconductor chip 1 to the outside. The semiconductor chip 1 is connected to the leads 3 by means of wires 4, respectively, so that it can transmit its output signals to the associated leads via the wires 4. A sealing resin 5 is molded on the semiconductor chip 1 and its peripheral elements in order to protect them from external oxidation and erosion.

In such a semiconductor package, the heat sink 2 serves to effectively discharge heat generated when the circuit of the semiconductor chip 1 operates. The heat sink 2 is made of copper exhibiting a high thermal conductivity. A ground bonding for the operation of the semiconductor chip is carried out on desired portions of the upper surface of the heat sink 2 using wires 4a. In order to obtain a strong wire bonding force for the ground bonding, the upper surface of the heat sink 2 is plated with a silver (Ag) layer or a double layer consisting of a lower layer made of nickel (Ni) and an upper layer made of palladium (Pd).

In the fabrication of the semiconductor package involving bonding the semiconductor chip on the heat sink, the wire bonding and molding processes are conducted under the condition in which the package is maintained at a high temperature. In particular, the process of curing the adhesive after conducting the wire bonding process is carried out under the condition in which the package is heated to a high temperature of about 200° C. in an oven. The semiconductor chip 1 and heat sink 2 along with the epoxy resin used to bond the semiconductor chip 1 to the upper surface of the heat sink 2 shrink and expand due to high temperature heat while the above-mentioned processes are carried out. This is because the materials of the semiconductor chip 1 and heat sink 2 have thermal coefficients different from that of the epoxy resin. As a result, moisture may penetrate between the semiconductor chip and heat sink while the high temperature processes involved in the fabrication of the semiconductor package are carried out, thereby resulting in an interface peel-off between the semiconductor chip and heat sink. Consequently, the package may have cracks or otherwise have a poor quality.

Furthermore, the interface peel-off phenomenon degrades the bonding force of the epoxy resin serving to bond the semiconductor chip to the heat sink in the above-mentioned case wherein the heat sink 2 is plated with the double layer consisting of nickel and palladium layers on its upper surface. As a result, the interface peel-off and formation of cracks become severe. In other words, the above-mentioned conventional method involves the occurrence of a severe interface peel-off at the portion of the heat sink 2 to which the semiconductor chip is bonded, even though good ground bonding and power bonding can be achieved in that the heat sink 2 is plated with the double layer consisting of nickel and palladium layers on its upper surface. As a result, the semiconductor package fabricated in accordance with the conventional method may have a poor quality, so that it may involve a degradation in reliability and performance.

SUMMARY OF THE INVENTION

Therefore, an object of the invention is to solve the above-mentioned problems involved in the prior art and to provide a semiconductor package provided with a heat sink having a black-oxidized upper surface portion to which a semiconductor chip is attached, thereby improving the bonding between the semiconductor chip and heat sink to prevent the occurrence of an interface peel-off and the formation of cracks.

Another object of the invention is to provide a semiconductor package provided with a heat sink which includes a ground/power bonding plane capable of achieving an easy ground bonding and power bonding independently of leads while enabling all ground and power signals to be transmitted via one lead, thereby achieving an improvement in quality of the semiconductor package.

Another object of the invention is to provide a semiconductor package provided with a heat sink which includes a plane having a multilayer structure consisting of ground/power bonding conductive thin films, thereby easily achieving an independent ground bonding and an independent power bonding at any angle of the semiconductor chip of the package, so that all power and ground signals from the semiconductor chip can be processed via one lead.

Another object of the invention is to provide a semiconductor package provided with a heat sink having an oxidized upper surface portion to which a semiconductor chip is attached, thereby improving the bonding between the semiconductor chip and heat sink, while having a silver layer or a doubly plated layer consisting of a nickel layer and a palladium layer formed over the nickel layer on the remaining upper surface portion on which the semiconductor chip is not attached, thereby achieving an easy ground bonding and power bonding.

In accordance with one aspect, the present invention provides a semiconductor package comprising: a semiconductor chip integrated with an electronic circuit; a heat sink having an upper surface on which the semiconductor chip is centrally attached by an epoxy resin layer coated on the upper surface, the heat sink being provided with an oxidation layer formed on the upper surface thereof; a plurality of leads attached to opposite lateral end portions of the upper surface of the heat sink by non-conductive bonding tapes, respectively, the leads serving to transmit signals from the semiconductor chip to the outside of the package; wires adapted to couple electrical signals from the semiconductor chip to the leads, respectively; a plane comprised of a conductive thin plate and bonded between the heat sink and the leads at each lateral end portion of the heat sink by a non-conductive tape to provide a ground bonding or power bonding; and a sealing resin molded on the semiconductor chip and peripheral elements thereof in order to protect them from external oxidation and erosion.

In accordance with another aspect, the present invention provides a semiconductor package comprising: a semiconductor chip integrated with an electronic circuit; a heat sink having an upper surface on which the semiconductor chip is centrally attached by an epoxy resin layer coated on the upper surface; a plurality of leads attached to opposite lateral end portions of the upper surface of the heat sink by bonding tapes, respectively, the leads serving to transmit signals from the semiconductor chip to the outside of the package; wires adapted to couple electrical signals from the semiconductor chip to the leads, respectively; a sealing resin molded on the semiconductor chip and peripheral elements thereof in order to protect them from external oxidation and erosion; and an oxidation layer formed on a portion of the upper surface of the heat sink to which the semiconductor chip is attached, and a silver layer plated on the remaining upper surface portion of the heat sink, whereby an easy ground bonding and power bonding can be achieved.

In accordance with another aspect, the present invention provides a method for surface-treating heat sinks comprising the steps of: preparing a copper substrate which will be used as the heat sinks; masking portions of the upper surface of the copper substrate to which semiconductor chips will be attached, respectively, using a mask; plating a silver layer or a double layer consisting of a nickel layer and a palladium layer formed over the nickel layer on the upper surface portion of the copper substrate exposed after the completion of the masking step; removing the mask; forming an oxidation film on the upper surface portion of the copper substrate exposed by the removal of the mask, namely, not plated with the nickel layer or double layer; and cutting the resulting copper substrate into pieces of a desired size.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
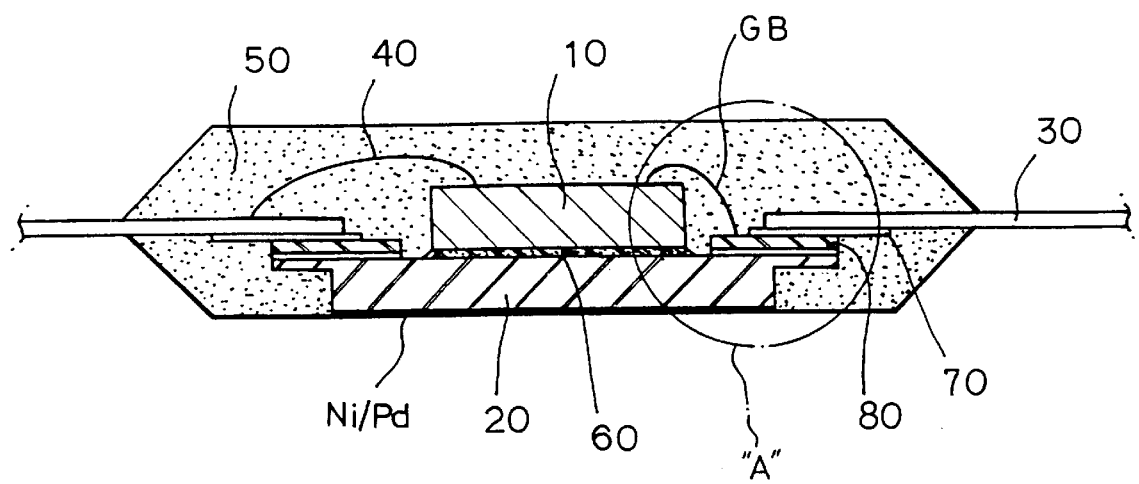
FIG. 1 is a sectional view illustrating the structure of a semiconductor package according to a first embodiment of the present invention.
Figure 2:
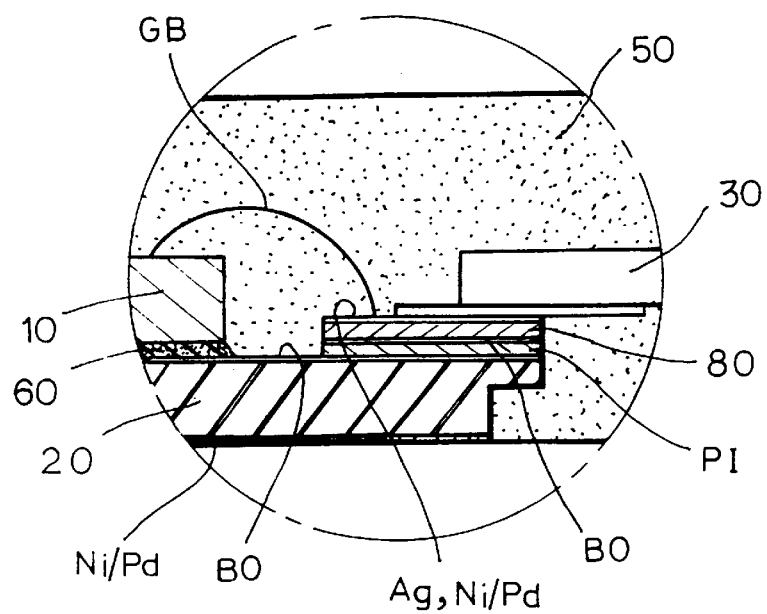
FIG. 2 is an enlarged view of the portion "A" of FIG. 1.

FIG. 1 is a sectional view illustrating the structure of a semiconductor package according to a first embodiment of the present invention. As shown in FIG. 1, the semiconductor package includes a semiconductor chip 10 integrated with an electronic circuit, and a heat sink 20 having an upper surface on which the semiconductor chip 10 is centrally attached by an epoxy resin layer 60. An oxidation layer is formed over the upper surface of the heat sink 20 to which the semiconductor chip 10 is attached. A plurality of leads 30 are attached to opposite lateral end portions of the upper surface of the heat sink 20 by bonding tapes 70, respectively. The leads 30 serve to transmit signals from the semiconductor chip 10 to the outside of the package. The semiconductor chip 10 is connected to the leads 30 by means of wires 40, respectively, so that it can transmit its output signals to the associated leads 30 via the wires 40. As best shown in FIG. 2, a plane 80 is bonded between the heat sink 20 and the leads 30 at each lateral end portion of the heat sink 20 by means of a non-conductive tape to provide a ground bonding or power bonding. A sealing resin 50 is molded on the semiconductor chip 10 and its peripheral elements in order to protect them from external oxidation and erosion.

The plane 80 is comprised of a conductive thin plate. The plane 80 is provided at its upper surface with wire bonding areas on which a silver layer or a double layer consisting of a nickel layer as a lower layer and a palladium layer as an upper layer is plated. The plane 80 is bonded to the upper surface of the heat sink 20 by the non-conductive tape. The non-conductive tape may be a polyimide tape. Preferably, the heat sink 20 is plated with a nickel layer or a double layer consisting of a nickel layer as a lower layer and a palladium layer as an upper layer. Accordingly, it is possible to effectively prevent the heat sink 20 from being oxidized from its lower surface to its upper surface.

Figure 3:
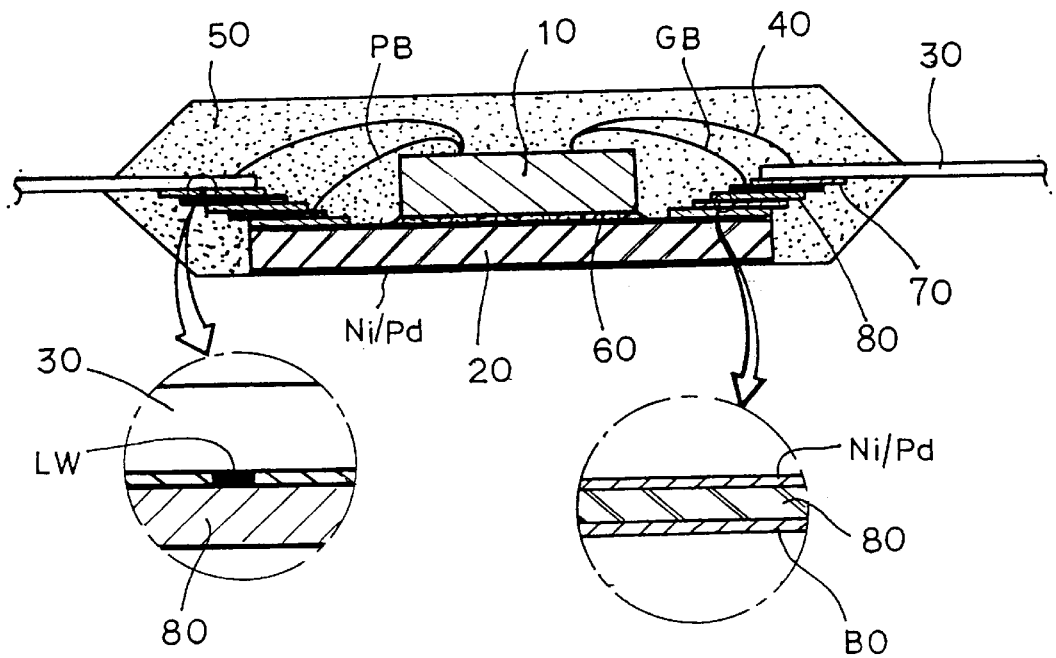
FIG. 3 is a sectional view illustrating the structure of a semiconductor package according to a second embodiment of the present invention.

FIG. 3 is a sectional view illustrating the structure of a semiconductor package according to a second embodiment of the present invention. In FIG. 3, elements respectively corresponding to those in FIG. 1 are denoted by the same reference numerals. In accordance with this embodiment, the semiconductor package includes a pair of laminated planes 80 bonded between the heat sink 20 and the leads 30 at each lateral end portion of the heat sink 20. One of the planes 80 serves to provide a ground bonding whereas the other plane 80 serves to provide a power bonding. Each plane 80 is plated with a double layer consisting of a nickel layer as a lower layer and a palladium layer as an upper layer at bonding areas of its upper surface. The lower surface of each plane 80 is black-oxidized (BO).

To the upper plane 80, the leads 30 are directly attached using laser welding. Accordingly, it is possible to connect the upper plane 80 to outer leads without using any additional wire bonding. In this case, signals from all wires 40 bonded to the upper plane 80 can be concentrated on a selected one of the laser-welded (LW) leads 30 so that the selected lead can be used as a ground or power pin.

In this way, at least one plane 80 is bonded between the heat sink 20 and the leads 30 at each lateral end portion of the heat sink 20 to provide ground bonding and power bonding. The upper surface of the heat sink 20 is black-oxidized, thereby improving the bonding force obtained between the semiconductor chip 10 and heat sink 20 by the epoxy resin layer 60. Accordingly, it is possible to prevent an interface peel-off phenomenon between the semiconductor chip 10 and heat sink 20. Since the plane, which is provided between the heat sink 20 and leads 30 for the ground bonding and power bonding, has a multilayer structure, the ground bonding can be independently achieved. In particular, all power lines may be bonded to the plane 80 for the power bonding. In this case, all signals from the power lines can be processed through one lead.

Figure 4:
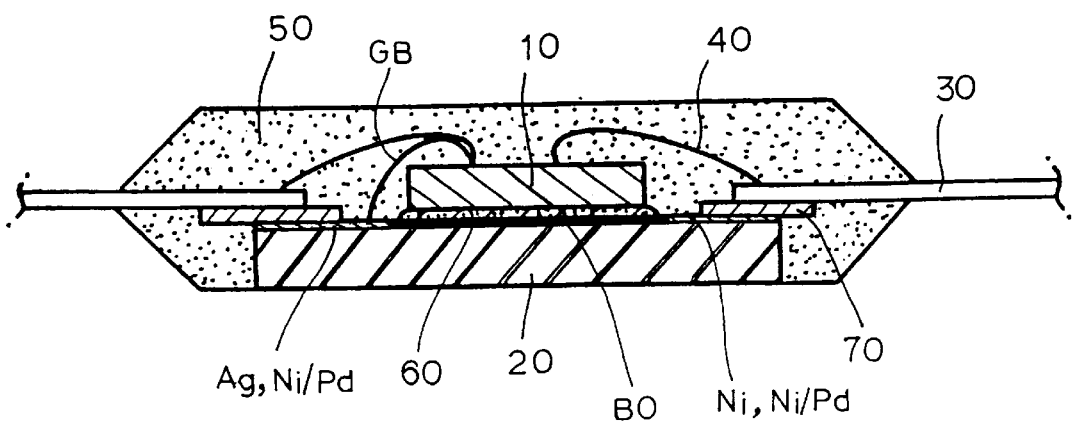
FIG. 4 is a sectional view illustrating the structure of a semiconductor package according to a third embodiment of the present invention.

FIG. 4 is a sectional view illustrating the structure of a semiconductor package according to a third embodiment of the present invention. In FIG. 4, elements respectively corresponding to those in FIG. 1 are denoted by the same reference numerals. As shown in FIG. 4, the semiconductor package includes a semiconductor chip 10 integrated with an electronic circuit, and a heat sink 20 having an upper surface on which the semiconductor chip 10 is centrally attached by an epoxy resin layer 60. A plurality of leads 30 are attached to opposite lateral end portions of the upper surface of the heat sink 20 by bonding tapes 70, respectively. The leads 30 serve to transmit signals from the semiconductor chip 10 to the outside of the package. The semiconductor chip 10 is connected to the leads 30 by means of wires 40, respectively, so that it can transmit its output signals to the associated leads 30 via the wires 40. A sealing resin 50 is molded on the semiconductor chip 10 and its peripheral elements in order to protect them from external oxidation and erosion. The upper surface of the heat sink 20 is black-oxidized at the region to which the semiconductor chip 10 is attached. The remaining upper surface portion of the heat sink 20 not attached with the semiconductor chip 10 is plated with silver. Accordingly, it is possible to easily achieve ground bonding and power bonding.

Instead of the silver layer, a double layer consisting of a nickel layer as a lower layer and a palladium layer as an upper layer may be plated on the upper surface portion of the heat sink 20 not attached with the semiconductor chip 10. In this case, the palladium layer, which serves to prevent the nickel layer from being oxidized, should not be of a thickness causing difficulty in performing the wire bonding process. When the palladium layer has an appropriately small thickness, the ground bonding and power bonding can be easily achieved.

In accordance with the present invention, it is possible to prevent an interface peel-off phenomenon from occurring between the semiconductor chip 10 and heat sink 20 because the bonding force of the epoxy resin layer 60 can be enhanced by black-oxidizing the upper surface portion of the heat sink 20 to which the semiconductor chip 10 is attached. It is also possible to achieve easy ground bonding and power bonding because the remaining upper surface portion of the heat sink 20 not attached with the semiconductor chip 10 is plated with a silver layer or a double layer consisting of a lower layer made of nickel and an upper layer made of palladium.

Figure 5:
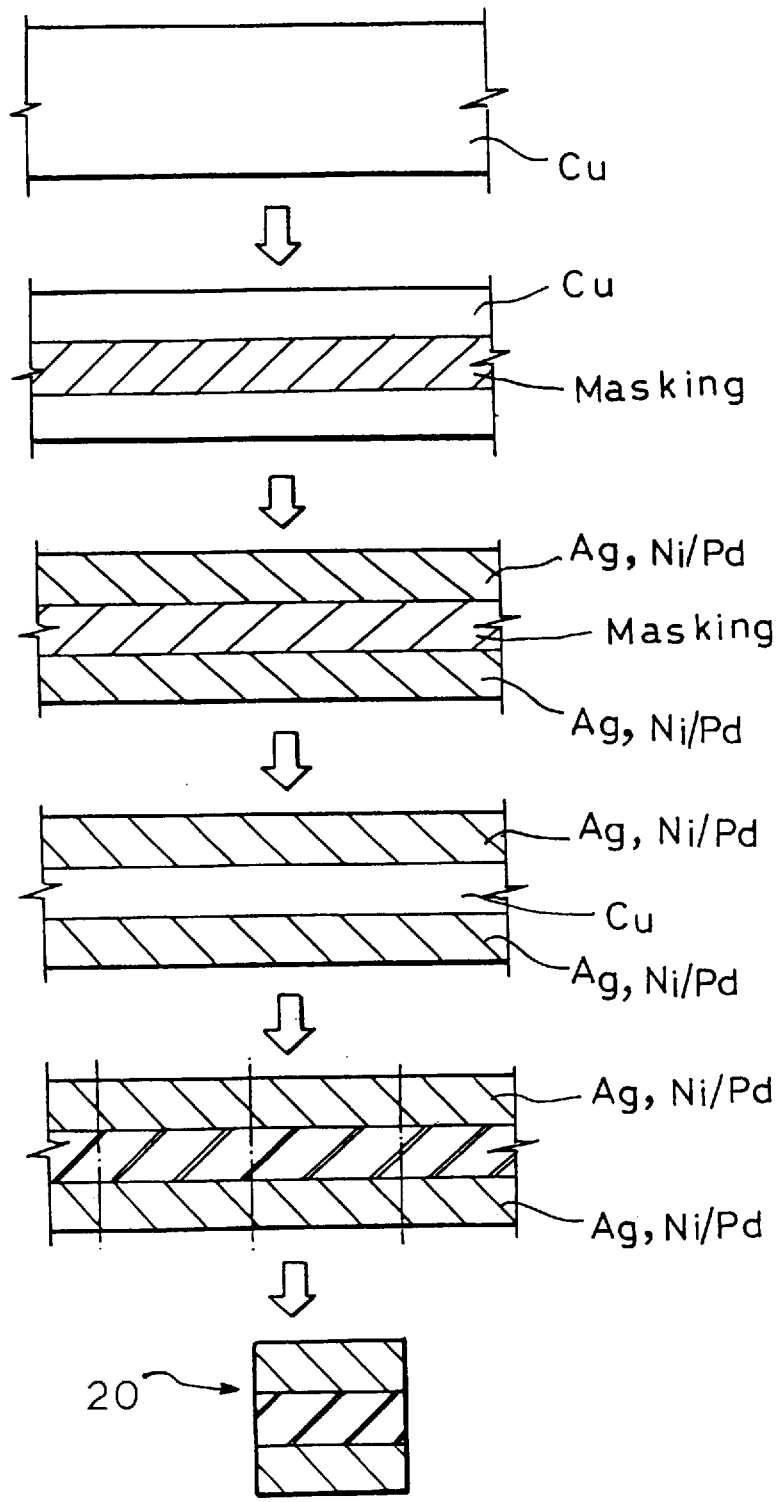
FIG. 5 is a plan view illustrating sequential steps of a method for surface-treating heat sinks in accordance with the present invention.
Figure 6:
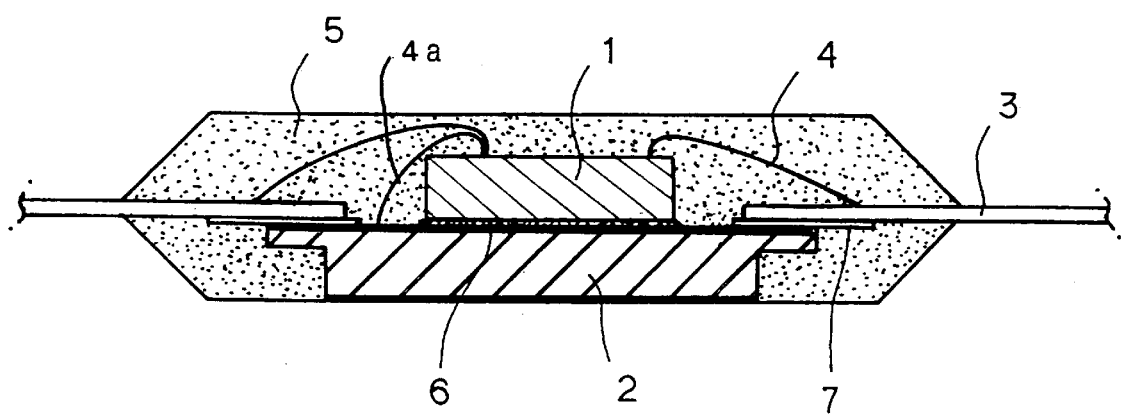
FIG. 6 is a cross-sectional view of a typical prior art semiconductor package with a heat sink.

Meanwhile, FIG. 5 is a view illustrating sequential steps of a method for surface-treating the upper surface of the heat sink 20 to black-oxidize the upper surface portion of the heat sink 20 to which the semiconductor chip 10 is attached while plating the remaining upper surface portion of the heat sink 20 with a silver layer or a double layer consisting of a nickel layer and a palladium layer formed over the nickel layer. In accordance with this method, first is prepared a copper substrate which will be used as heat sinks. Portions of the upper surface of the copper substrate to which semiconductor chips will be attached is then masked, using a mask. Thereafter, the exposed upper surface portion of the copper substrate is plated with a silver layer or a double layer consisting of a nickel layer and a palladium layer formed over the nickel layer. After the completion of the plating step, the mask is removed. Subsequently, the upper surface portions of the copper substrate exposed by the removal of the mask, namely, not plated with the nickel layer or double layer, are black-oxidized. The resulting copper substrate is finally cut into pieces of a desired size to obtain heat sinks.

When a semiconductor chip is attached to the black-oxidized upper surface portion of a heat sink which is obtained in the above-mentioned manner, by an epoxy resin layer coated on the upper surface portion, the epoxy resin layer exhibits an enhanced bonding force, thereby preventing an interface peel-off phenomenon from occurring between the semiconductor chip and heat sink. Accordingly, an improvement in the reliability and performance of the finally produced package is achieved. On the other hand, ground bonding and power bonding can be easily carried out on the upper surface portion of the heat sink on which the silver layer or the double layer consisting of the nickel layer and the palladium layer formed over the nickel layer is plated.

As apparent from the above description, the present invention can enhance the bonding force obtained between the heat sink and semiconductor chip by forming a copper oxide film on the upper surface portion of the heat sink to which the semiconductor chip is attached. By virtue of the enhanced bonding force, it is possible to prevent the occurrence of an interface peel-off phenomenon and the formation of cracks. In accordance with the present invention, it is also possible to achieve easy ground bonding and power bonding by plating a silver layer or a double layer consisting of a nickel layer and a palladium layer formed over the nickel layer on the remaining upper surface portion of the heat sink or by bonding a ground/power bonding plane between the heat sink and leads at the above-mentioned remaining upper surface portion. As a result, an improvement in reliability of the finally produced semiconductor package is achieved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
   a semiconductor chip integrated with an electronic circuit;
   a heat sink having an upper surface on which the semiconductor chip is centrally attached by an epoxy resin layer coated on the upper surface, the heat sink being provided with an oxidation layer formed on the upper surface thereof;
   a plurality of leads attached to opposite lateral end portions of the upper surface of the heat sink by non-conductive bonding tapes, respectively, the leads extending laterally to a position outside of the package and serving to transmit signals from the semiconductor chip to the outside of the package;
   wires for electrically connecting the semiconductor chip to the leads, respectively;
   a plane comprised of a conductive thin plate and bonded between the heat sink and the leads at each lateral end portion of the heat sink by a non-conductive tape, said plate including wire bonding areas extending inwardly from said tape to provide a ground bonding area or a power bonding area; and
   a sealing resin molded on the semiconductor chip and peripheral elements thereof in order to protect them from external oxidation and erosion.

2. The semiconductor package in accordance with claim 1, wherein the plane has a multilayer plane structure consisting of a first conductive thin plate forming a ground bonding area, a second conductive thin plate forming a power bonding area, and a non-conductive tape interposed between the first and second conductive thin plates.

3. The semiconductor package in accordance with claim 1 or 2, wherein the conductive thin plate is a copper thin plate.

4. The semiconductor package in accordance with claim 1 or 2, wherein the non-conductive bonding tape is a polyimide tape.

5. A semiconductor package comprising:

a semiconductor chip integrated with an electronic circuit;

a heat sink having an upper surface on which the semiconductor chip is centrally attached by an epoxy resin layer coated on the upper surface, the heat sink being provided with an oxidation layer formed on the upper surface thereof;

a plurality of leads attached to opposite lateral end portions of the upper surface of the heat sink by non-conductive bonding tapes, respectively, the leads serving to transmit signals from the semiconductor chip to the outside of the package;

wires for electrically connecting the semiconductor chip to the leads respectively;

a plane comprised of a conductive thin plate and bonded between the heat sink and the leads at each lateral end portion of the heat sink by a non-conductive tape to provide a ground bonding area or a power bonding area;

a sealing resin molded on the semiconductor chip and peripheral elements thereof in order to protect them from external oxidation and erosion; and wherein the plane is formed with oxidation films on upper and lower surfaces thereof, respectively.

6. The semiconductor package in accordance with claim 1 or 2, wherein the plane is plated with a silver layer on a portion of the upper surface thereof corresponding to a wire bonding region.

7. A semiconductor package comprising:

a semiconductor chip integrated with an electronic circuit;

a heat sink having an upper surface on which the semiconductor chip is centrally attached by an epoxy resin layer coated on the upper surface, the heat sink being provided with an oxidation layer formed on the upper surface thereof;

a plurality of leads attached to opposite lateral end portions of the upper surface of the heat sink by non-conductive bonding tapes, respectively, serving to transmit signals from the semiconductor chip to the outside of the package;

wires for electrically connecting the semiconductor chip to the leads, respectively;

a plane comprised of a conductive thin plate and bonded between the heat sink and the leads at each lateral end portion of the heat sink by a non-conductive tape to provide a ground bonding area or a power bonding area;

a sealing resin molded on the semiconductor chip and peripheral elements thereof in order to protect them from external oxidation and erosion; and wherein the plane is plated with a double layer consisting of a nickel layer and a palladium layer formed over the nickel layer on a portion of the upper surface thereof corresponding to a wire bonding region.

8. The semiconductor package in accordance with claim 7, wherein the nickel layer has a thickness relatively larger than that of the palladium layer.

9. A semiconductor package comprising:

a semiconductor chip integrated with an electronic circuit;

a heat sink having an upper surface on which the semiconductor chip is centrally attached by an epoxy resin layer coated on the upper surface, the heat sink being provided with an oxidation layer formed on the upper surface thereof;

a plurality of leads attached to opposite lateral end portions of the upper surface of the heat sink by non-conductive bonding tapes, respectively, serving to transmit signals from the semiconductor chip to the outside of the package;

wires for electrically connecting the semiconductor chip to the leads, respectively;

a plane comprised of a conductive thin plate and bonded between the heat sink and the leads at each lateral end portion of the heat sink by a non-conductive tape to provide a ground bonding area or a power bonding area;

a sealing resin molded on the semiconductor chip and peripheral elements thereof in order to protect them from external oxidation and erosion; and wherein the heat sink is plated with a nickel layer on a lower surface thereof.

10. The semiconductor package in accordance with claim 9, wherein a palladium layer is plated on the nickel layer.

11. The semiconductor package in accordance with claim 1 or 2, wherein the leads are in a welded connection to the plane.

12. a semiconductor package comprising:

a semiconductor chip integrated with an electronic circuit;

a heat sink having an upper surface on which the semiconductor chip is centrally attached by an epoxy resin layer coated on the upper surface;

a plurality of leads attached to opposite lateral end portions of the upper surface of the heat sink by bonding tapes, respectively, the leads serving to transmit signals from the semiconductor chip to the outside of the package;

wires for electrically connecting the semiconductor chip to the leads, respectively;

a sealing resin molded on the semiconductor chip and peripheral elements thereof in order to protect them from external oxidation and erosion; and an oxidation layer formed on a portion of the upper surface of the heat sink to which the semiconductor chip is attached, and a silver layer plated on the remaining upper surface portion of the heat sink, whereby an easy ground bonding and power bonding can be achieved.

13. The semiconductor package in accordance with claim 12, wherein a double layer consisting of a nickel layer and a palladium layer formed over the nickel layer is formed on the remaining upper surface portion of the heat sink, instead of the silver layer.

14. The semiconductor package in accordance with claim 12, wherein the nickel layer has a thickness relatively larger than the palladium layer.

15. The semiconductor package of claim 5 wherein the conductive thin plate is a copper thin plate.

* * * * *

UNITED STATES PATENT AND TRADEMARK OFFICE
CERTIFICATE OF CORRECTION

PATENT NO.     : 5,854,511
DATED          : December 29, 1998
INVENTOR(S)    : Won Sun Shin and Won Kyun Lee It is certified that error appears in the above-identified patent and that said Letters Patent is hereby corrected as shown below:

<u>Title page,</u>
Item [22], please delete the Filed Date of "Nov. 15, 1996" and insert -- Nov. 14, 1996 --.

Signed and Sealed this

Twenty-fourth Day of December, 2002

JAMES E. ROGAN
*Director of the United States Patent and Trademark Office*